United States Patent
Wang et al.

(10) Patent No.: US 9,196,542 B2
(45) Date of Patent: Nov. 24, 2015

(54) METHOD FOR MANUFACTURING SEMICONDUCTOR DEVICES

(71) Applicant: UNITED MICROELECTRONICS CORP., Hsin-Chu (TW)

(72) Inventors: Jun-Jie Wang, Changhua County (TW);
Po-Chao Tsao, New Taipei (TW);
Chia-Jui Liang, Tainan (TW);
Shih-Fang Tzou, Tainan (TW);
Chien-Ting Lin, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 188 days.

(21) Appl. No.: 13/899,581

(22) Filed: May 22, 2013

(65) Prior Publication Data
US 2014/0349452 A1    Nov. 27, 2014

(51) Int. Cl.
*H01L 21/8234* (2006.01)
*H01L 27/06* (2006.01)
*H01L 29/78* (2006.01)
*H01L 21/8238* (2006.01)

(52) U.S. Cl.
CPC .. *H01L 21/823468* (2013.01); *H01L 21/82345* (2013.01); *H01L 21/823462* (2013.01); *H01L 21/823842* (2013.01); *H01L 21/823857* (2013.01); *H01L 21/823864* (2013.01); *H01L 27/0629* (2013.01); *H01L 29/785* (2013.01)

(58) Field of Classification Search
CPC .............. H01L 21/823468; H01L 21/823864; H01L 21/823462; H01L 29/785; H01L 29/66795
USPC .......................................................... 438/238
See application file for complete search history.

(56) References Cited

U.S. PATENT DOCUMENTS

| | | |
|---|---|---|
| 5,892,282 A | 4/1999 | Hong |
| 6,033,963 A | 3/2000 | Huang |
| 6,066,533 A | 5/2000 | Yu |
| 6,096,659 A | 8/2000 | Gardner |
| 6,177,303 B1 | 1/2001 | Schmitz |
| 6,303,418 B1 | 10/2001 | Cha |
| 6,406,956 B1 | 6/2002 | Tsai |
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee |
| 6,696,345 B2 | 2/2004 | Chau |
| 6,790,719 B1 | 9/2004 | Adetutu |
| 6,794,234 B2 | 9/2004 | Polishchuk |
| 6,858,483 B2 | 2/2005 | Doczy |
| 6,887,762 B1 * | 5/2005 | Murthy et al. ............. 438/300 |

(Continued)

*Primary Examiner* — Savitr Mulpuri
(74) *Attorney, Agent, or Firm* — Winston Hsu; Scott Margo

(57) ABSTRACT

A method for manufacturing a semiconductor device is provided. A first stack structure and a second stack structure are formed to respectively cover a portion of a first fin structure and a second fin structure. Subsequently, a spacer is respectively formed on the sidewalls of the fin structures through an atomic layer deposition process and the composition of the spacers includes silicon carbon nitride. Afterwards, a interlayer dielectric is formed and etched so as to expose the hard mask layers. A mask layer is formed to cover the second stack structure and a portion of the dielectric layer. Later, the hard mask layer in the first stack structure is removed under the coverage of the mask layer. Then, a dummy layer in the first stack structure is replaced with a conductive layer.

15 Claims, 4 Drawing Sheets

(56) References Cited

U.S. PATENT DOCUMENTS

| | | | |
|---|---|---|---|
| 6,902,969 B2 | 6/2005 | Adetutu | |
| 6,921,711 B2 | 7/2005 | Cabral, Jr. | |
| 6,953,719 B2 | 10/2005 | Doczy | |
| 6,960,416 B2 | 11/2005 | Mui | |
| 6,967,131 B2 | 11/2005 | Saenger | |
| 6,972,225 B2 | 12/2005 | Doczy | |
| 7,029,966 B2 | 4/2006 | Amos | |
| 7,030,430 B2 | 4/2006 | Doczy | |
| 7,056,794 B2 | 6/2006 | Ku | |
| 7,064,050 B2 | 6/2006 | Cabral, Jr. | |
| 7,064,066 B1 | 6/2006 | Metz | |
| 7,074,664 B1 | 7/2006 | White | |
| 7,074,680 B2 | 7/2006 | Doczy | |
| 7,109,079 B2 | 9/2006 | Schaeffer, III | |
| 7,112,851 B2 | 9/2006 | Saenger | |
| 7,126,199 B2 | 10/2006 | Doczy | |
| 7,144,783 B2 | 12/2006 | Datta | |
| 7,148,548 B2 | 12/2006 | Doczy | |
| 7,153,734 B2 | 12/2006 | Brask | |
| 7,153,784 B2 | 12/2006 | Brask | |
| 7,157,378 B2 | 1/2007 | Brask | |
| 7,176,090 B2 | 2/2007 | Brask | |
| 7,183,184 B2 | 2/2007 | Doczy | |
| 7,186,605 B2 | 3/2007 | Cheng | |
| 7,193,893 B2 | 3/2007 | Forbes | |
| 7,208,361 B2 | 4/2007 | Shah | |
| 7,208,366 B2 | 4/2007 | Tsai | |
| 7,217,611 B2 | 5/2007 | Kavalieros | |
| 7,220,635 B2 | 5/2007 | Brask | |
| 7,316,949 B2 | 1/2008 | Doczy | |
| 7,317,231 B2 | 1/2008 | Metz | |
| 7,326,610 B2 | 2/2008 | Amos | |
| 7,355,281 B2 | 4/2008 | Brask | |
| 7,381,619 B2 | 6/2008 | Wang | |
| 7,390,709 B2 | 6/2008 | Doczy | |
| 7,407,876 B2 | 8/2008 | Ishizaka | |
| 7,488,656 B2 | 2/2009 | Cartier | |
| 7,556,998 B2 | 7/2009 | Park | |
| 7,700,479 B2 | 4/2010 | Huang | |
| 7,785,958 B2 | 8/2010 | Doczy | |
| 8,021,942 B2 * | 9/2011 | Wei et al. | 438/216 |
| 8,071,437 B2 | 12/2011 | Lin | |
| 8,445,334 B1 * | 5/2013 | Basker et al. | 438/149 |
| 8,524,556 B1 * | 9/2013 | Chiou et al. | 438/238 |
| 8,748,251 B2 * | 6/2014 | Na et al. | 438/230 |
| 8,772,146 B2 * | 7/2014 | Kim et al. | 438/586 |
| 8,802,524 B2 * | 8/2014 | Liao et al. | 438/212 |
| 8,828,814 B2 * | 9/2014 | Wang et al. | 438/183 |
| 8,847,281 B2 * | 9/2014 | Cea et al. | 257/192 |
| 8,877,625 B1 * | 11/2014 | Lian | 438/591 |
| 8,889,508 B2 * | 11/2014 | Yeh et al. | 438/238 |
| 8,901,675 B2 * | 12/2014 | Bu et al. | 257/407 |
| 8,906,760 B2 * | 12/2014 | Ranjan et al. | 438/197 |
| 2002/0127888 A1 | 9/2002 | Cho | |
| 2005/0090066 A1 * | 4/2005 | Zhu et al. | 438/300 |
| 2005/0095763 A1 | 5/2005 | Samavedam | |
| 2005/0202659 A1 | 9/2005 | Li | |
| 2005/0275035 A1 | 12/2005 | Mathew | |
| 2006/0024953 A1 | 2/2006 | Papa Rao | |
| 2006/0040482 A1 | 2/2006 | Yang | |
| 2006/0054943 A1 | 3/2006 | Li | |
| 2007/0037335 A1 | 2/2007 | Chambers | |
| 2007/0082445 A1 | 4/2007 | Yang | |
| 2007/0138559 A1 | 6/2007 | Bohr | |
| 2007/0145591 A1 | 6/2007 | Yano | |
| 2007/0148838 A1 | 6/2007 | Doris | |
| 2007/0210354 A1 | 9/2007 | Nabatame | |
| 2007/0259519 A1 | 11/2007 | Yang | |
| 2007/0262451 A1 | 11/2007 | Rachmady | |
| 2007/0272123 A1 | 11/2007 | Kennedy | |
| 2008/0048217 A1 * | 2/2008 | Kim et al. | 257/288 |
| 2008/0076216 A1 | 3/2008 | Pae | |
| 2008/0224235 A1 | 9/2008 | Lavoie | |
| 2008/0318371 A1 | 12/2008 | Lin | |
| 2009/0039433 A1 | 2/2009 | Yang | |
| 2009/0057769 A1 | 3/2009 | Wei | |
| 2009/0057787 A1 | 3/2009 | Matsuki | |
| 2009/0166769 A1 | 7/2009 | Metz | |
| 2009/0186458 A1 | 7/2009 | Yu | |
| 2010/0044783 A1 | 2/2010 | Chuang | |
| 2010/0052066 A1 | 3/2010 | Yu | |
| 2010/0052074 A1 | 3/2010 | Lin | |
| 2010/0065926 A1 | 3/2010 | Yeh | |
| 2010/0068877 A1 | 3/2010 | Yeh | |
| 2010/0081262 A1 | 4/2010 | Lim | |
| 2010/0087055 A1 | 4/2010 | Lai | |
| 2010/0124818 A1 | 5/2010 | Lee | |
| 2010/0244141 A1 | 9/2010 | Beyer | |
| 2010/0301350 A1 * | 12/2010 | Tamura et al. | 257/77 |

* cited by examiner

METHOD FOR MANUFACTURING SEMICONDUCTOR DEVICES

BACKGROUND OF THE INVENTION

1. Field of the Invention

The present invention generally relates to the field of manufacturing integrated circuits and, more particularly, to a method for concurrently manufacturing a metal gate for a non-planar semiconductor device and a polysilicon resistor.

2. Description of the Prior Art

With the trend in the industry being towards scaling down the size of metal oxide semiconductor transistors (MOS), three-dimensional or non-planar transistor technology, such as fin field effect transistor technology (fin FET) has been developed to replace planar MOS transistors. The three-dimensional structure of a fin FET increases the overlapping area between the gate and the fin structure of the silicon substrate, and accordingly, the channel region is more effectively controlled. The drain-induced barrier lowering (DIBL) effect and short channel effect is therefore reduced. The channel region is also longer under the same gate length, and thus the current between the source and the drain is increased. In addition, the threshold voltage of the fin FET can be further controlled by adjusting the work function of the gate. Currently, in order to further increase the performances of non-planar transistors, metal gates are commonly used in place of the conventional polysilicon gates as control electrodes. Two processing approaches are mainly used to obtain metal gate structures: a gate first process or a gate last process.

Nowadays, since integrated circuits often include various kinds of semiconductor devices, such as non-planar transistors, diodes, e-fuses, polysilicon resistors and the like, these kinds of semiconductor devices need to be integrated and fabricated through the same series of processes. However, many unavoidable drawbacks usually appear during the integration process. For example, a metal gate electrode and a resistor are often formed through two different steps in conventional processes. Since the metal gate electrode is fabricated prior to the formation of the resistor, this implies a duality of processing steps that incurs unnecessary processing cost.

In another case, during processes for replacing a dummy gate electrode in a dummy gate structure with a metal gate electrode, a polishing process is often carried out to remove entire hard masks in the dummy gate structure. The ability to control the-end point of the polishing process is critical since this end-point determines the height of the subsequently formed metal gate electrode and is therefore related to the performances of the non-planar transistor. Unfortunately, the height of the gate structure is often seriously reduced during this polishing process.

In order to overcome the above-mentioned drawbacks, a method for concurrently fabricating a metal gate and a polysilicon resistor in a non-planar semiconductor device is still needed.

SUMMARY OF THE INVENTION

One objective of the present invention is to integrate processes for manufacturing a metal gate and a polysilicon resistor.

Another objective of the present invention is to eliminate the negative effects on a gate height due to corresponding removing process.

To this end, a method for manufacturing a semiconductor device is provided according to one embodiment of the present invention. First, a first fin structure and a second fin structure are formed on a substrate. Then, a first stack structure and a second stack structure are formed to respectively cover a portion of the first fin structure and of the second fin structure. The first stack structure and the second stack structure respectively include a dummy layer and a hard mask layer from bottom to top. Subsequently, a spacer is respectively formed on the sidewalls of the first fin structure and the second fin structure through an atomic layer deposition (ALD) process. The composition of the spacers preferably includes silicon carbon nitride. Afterwards, a dielectric layer is formed to cover the first stack structure, the second stack structure and the spacers. The dielectric layer is then etched so as to expose each of the hard mask layers. A mask layer is formed to cover the second stack structure and a portion of the dielectric layer. Later, the hard mask layer in the first stack structure is removed under the coverage of the mask layer. Then, the dummy layer in the first stack structure is removed to form a trench. Finally, the trench is filled up with a conductive layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
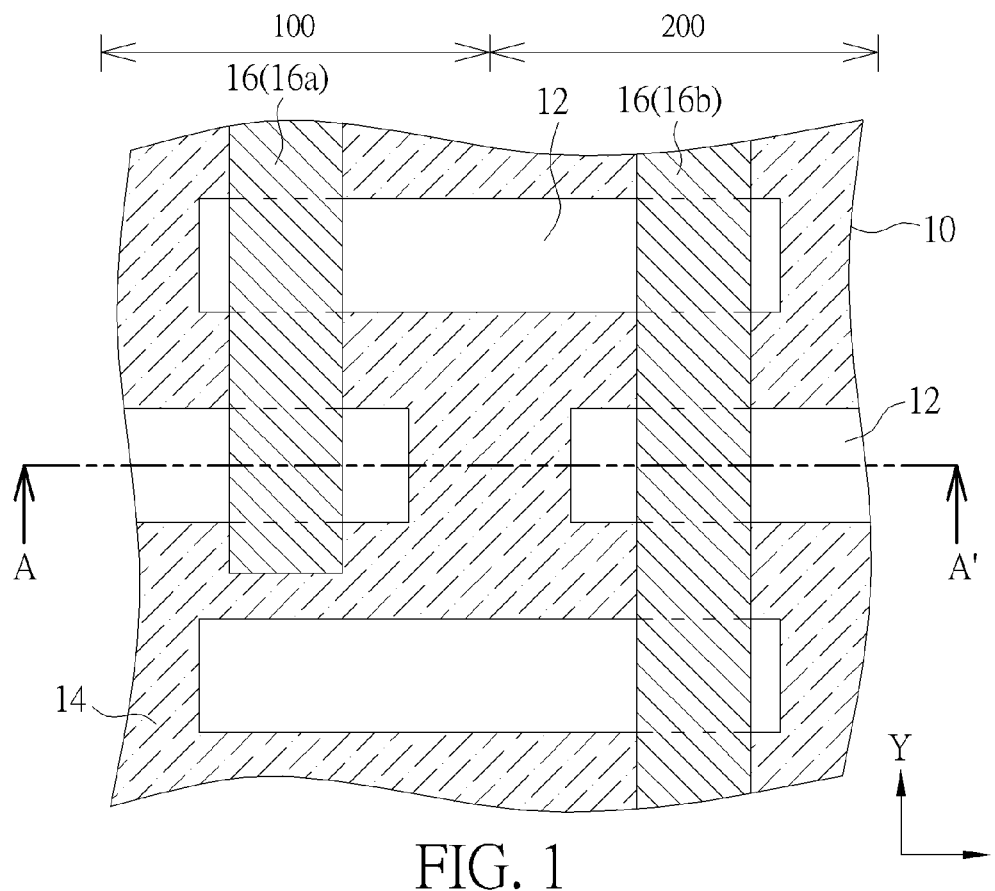
FIG. 1 is a schematic top view showing a structure at the beginning of a manufacturing process for a semiconductor device according to one embodiment of the invention.

It should be noted that all the figures are diagrammatic. Relative dimensions and proportions of parts of the drawings have been shown exaggerated or reduced in size for the sake of clarity and convenience in the drawings. The same reference signs are generally used to refer to corresponding or similar features in modified and different embodiments.

DETAILED DESCRIPTION

In the following description, numerous specific details are given to provide a thorough understanding of a method related to the invention. It will, however, be apparent to one skilled in the art that the invention may be practiced without these specific details. Furthermore, some well-known system configurations and process steps are not disclosed in detail, as these should be well-known to those skilled in the art.

Figure 2:
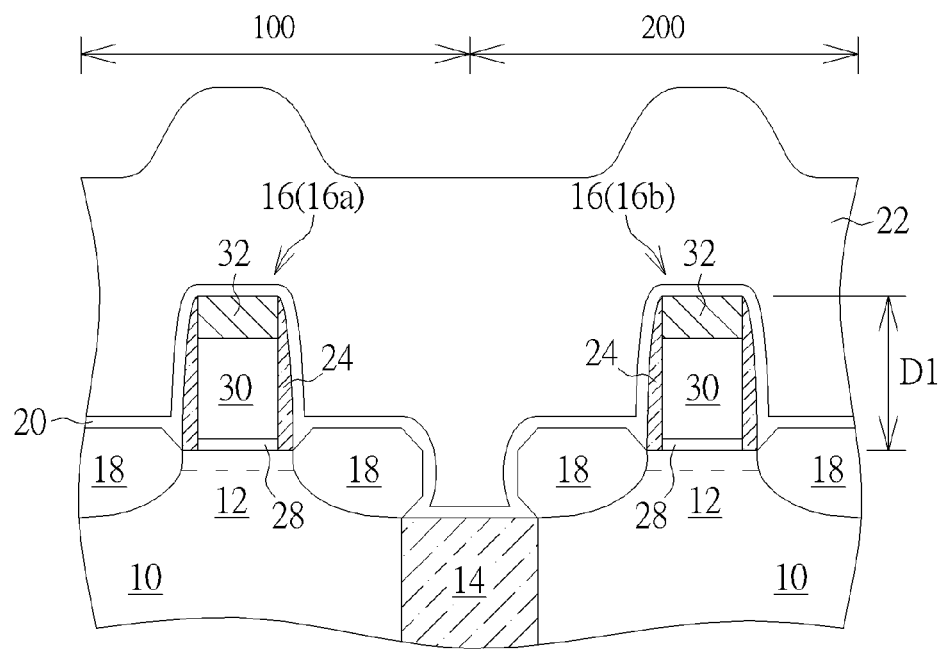
FIG. 2 is a schematic cross-sectional diagram taken along a line A-A' in FIG. 1.

Please refer to FIG. 1 and FIG. 2. FIG. 1 is a schematic top-view showing a structure at the beginning of a manufacturing process for a semiconductor device according to a first embodiment of the invention. FIG. 2 is a schematic cross-sectional diagram taken along a line A-A' in FIG. 1. At this stage, a substrate 10 is provided, such as a silicon substrate, a silicon germanium substrate, a silicon-on-insulator (SOI) substrate or the likes, but not limited thereto. A first region and a second region are defined on the substrate 10, which may respectively correspond to a transistor region 100 and a non-transistor region 200 of a semiconductor device. They may also respectively correspond to a region having gate-last transistors and a region having gate-first transistors, but not limited thereto.

Then, a plurality of fin structures 12 is formed on the substrate 10 through a suitable image transfer process. According to this embodiment, the fin structures 12 are formed on the surface of the substrate 10 within the transistor region 100 and the non-transistor region 200 through sidewall image transfer (SIT) processes and fin cut-off processes, but not limited thereto. As shown in FIG. 1, the fin structures 12 are arranged to have a layout extending along a first direction X and a second direction Y, wherein the long axis of each of the fin structure 12 is parallel to the first direction X, but not limited thereto. It should be noted that, the fin cut-off process may be omitted if required and in this way the fin structures 12 shown in FIG. 1 may extend continuously along the first direction X. After the formation of the fin structures 12, an isolation layer 14, such as a shallow trench isolation (STI) layer, is optionally formed around the periphery of the fin structures 12 to electrically isolate each fin structure 12. Preferably, the top surface of the isolation layer 14 is lower than that of the fin structures 12.

Subsequently, a plurality of stack structures 16 having a first predetermined height D1 may be formed over the substrate 10 to respectively cover portions of the corresponding fin structures 12 within the transistor region 100 and the non-transistor region 200. To put it more concretely, processes for fabricating these stack structures 16 may at least include forming a stack layer (not shown) over the entire substrate 10 and then pattering the stack layer into the stack structures 16 through single or multiple etching processes. The stack layer over the substrate 10 may include at least an interfacial layer, a semiconductor layer and a hard mask layer sequentially stacked form bottom to top. As shown in FIG. 2, each stack structure 16 may include at least an interfacial layer 28, a semiconductor layer 30 and a hard mask layer 32 sequentially stacked from bottom to top. According to this embodiment, the composition of the interfacial layer 28 is chosen from dielectric materials such as oxides or nitrides. The semiconductor layer 30 may comprise silicon material, such as lightly doped polysilicon, and it may, however, comprise undoped polysilicon, doped polysilicon, amorphous silicon or the likes. The hard mask layer 32 is preferably composed of silicon nitride and it could be also composed of $SiO_2$, SiN, SiC, and/or SiON, but not limited thereto. The stack structure 16 within the corresponding transistor region 100 and the non-transistor region 200 may be respectively named as a first stack structure and a second stack structure. In this case, each stack structure 16 within the transistor region 100 may be a dummy gate structure 16a for a transistor, while each stack structure 16 within the non-transistor region 200 may be an e-fuse, a capacitor or a resistor structure or other suitable non-transistor structures. Preferably, the stack structure 16 within the non-transistor region 200 is a resistor structure 16b. According to this embodiment, the semiconductor layer 30 within the dummy gate structure 16a may be regarded as a dummy gate electrode since it will be removed during the following removing process.

Still referring to FIG. 2; subsequently, spacers 24 at least composed of silicon carbon nitride (SiCN) are respectively formed on each sidewall of the dummy gate structure 16a and the resistor structure 16b. The spacers 24 may be formed through a suitable deposition process such as an atomic layer deposition (ALD) process, but not limited thereto. According to this embodiment, the ALD process may include a plurality of cyclic processes, i.e. adsorption-purge-adsorption-purge. For example, in a case wherein a composition of the spacers 24 is SiCN, each cyclic process may correspond to the steps of providing silicon precursor, providing purge gas, providing nitrogen and/or carbon precursor, providing purge gas. In this way, the nitrogen and/or carbon precursor, such as amine ($NH_3$) and/or carbon tetrachloride ($CCl_4$), and the silicon precursor, such as silane ($SiH_4$), can be provided alternately to form at least a SiCN layer conformally covering the stack structures 16. Additionally, the above processes may further include a thermal process and a plasma process in order to increase the reactivity of the compounds. It should be noted that each of the spacers 24 may be a single-layered spacer, a double-layered spacer or a multiple-layered spacer. Preferably, each of the spacers 24 is a double-layered spacer including an oxide layer and a SiCN layer sequentially stacked from bottom to top.

Afterwards, lightly doped drain and source/drain (not shown) may be formed in the respective fin structures 12 adjacent to two sides of the spacer 24 through ion implantation processes. After the formation of the lightly doped drain and the source/drain, an etching process and a selective epitaxial growth (SEG) process is optionally carried out, so as to respectively form epitaxial layers (not shown) at two sides of each of the stack structures 16 within the transistor region 100 and/or the non-transistor region 200 so that they can induce predetermined compressive stress or tensile stress to the carrier channel within the transistor region 100. In this embodiment, the composition of the epitaxial layers 18 may include silicon germanium (SiGe), silicon phosphorous (SiP) or silicon carbide (SiC). The above-mentioned epitaxial layers may respectively have a single-layered or multi-layered structure. Moreover, the SEG process for the epitaxial layers 18 of the present embodiment, despite of being conducted after the formation of the lightly doped drain and the source/drain, could also be performed before the lightly doped drain and the source/drain are formed.

In the following process, a contact etch stop layer (CESL) 20 is formed through a suitable deposition process, such as an ALD process, so as to conformally cover the epitaxial layers 18, the spacers 24 and the stack structures 16. Preferably, the CESL 20 is composed of SiCN and may optionally have a suitable stress so as to increase the mobility of the carriers. After the formation of the CESL, a dielectric layer, such as an interlayer dielectric layer (ILD) 22 composed silicon oxide, is formed on the substrate 10 to cover the fin structures 12, the isolation layer 14, the stack structures 16 and the epitaxial layers 18 entirely.

Figure 3:
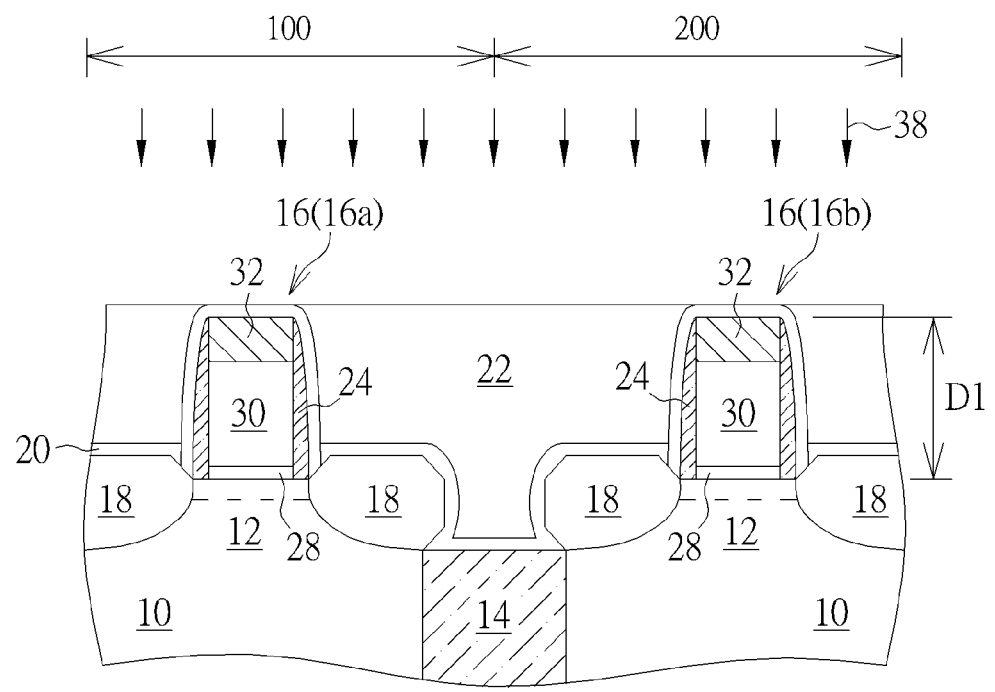
FIG. 3 is a schematic cross-sectional diagram showing a process for polishing an interlayer dielectric until the exposure of a contact etch stop layer according to one embodiment of the invention.

Please refer to FIG. 3. FIG. 3 is a schematic cross-sectional diagram showing a process for polishing an interlayer dielectric until the exposure of a contact etch stop layer according to one embodiment of the invention. That is to say, after the formation of the ILD 20, a planarizing process 38, such as a chemical mechanical polishing (CMP) and/or an etching process, is performed to partially remove and planarize the ILD 22 until the exposure of the CESL 20. In other words, the top surface of the ILD 22 may be substantially aligned with that of the CESL 20 after the accomplishment of the planarizing process 38.

Figure 4:
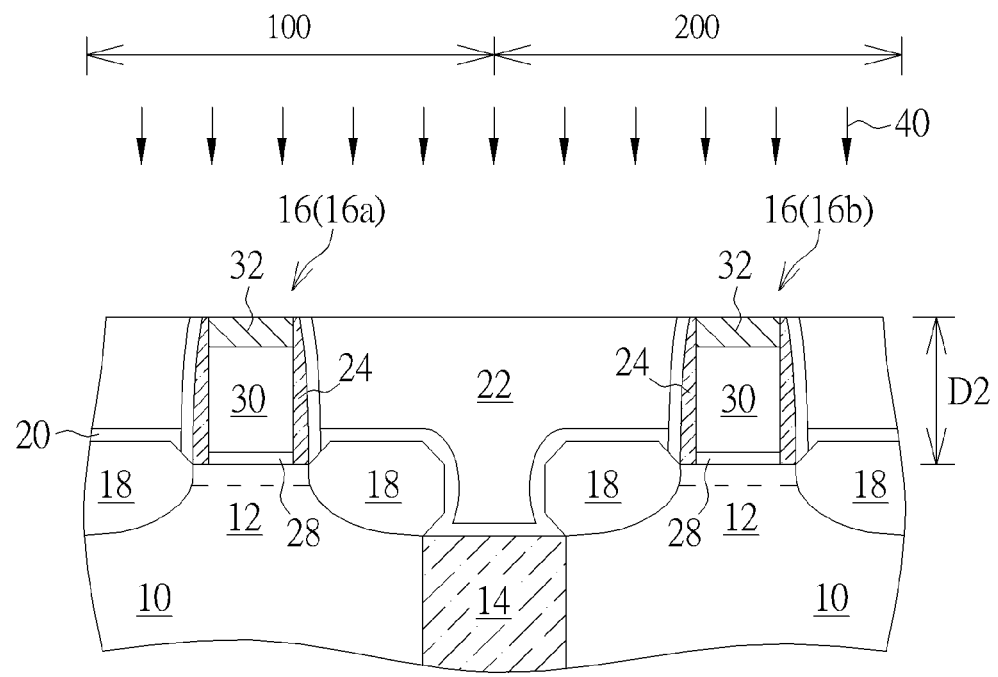
FIG. 4 is a schematic cross-sectional diagram showing a process for etching a contact etch stop layer until the exposure of hard mask layers according to one embodiment of the invention.

Refer now to FIG. 4; FIG. 4 is a schematic cross-sectional diagram showing a process for etching a contact etch stop layer until the exposure of hard mask layers according to one embodiment of the invention. At this stage, a dry etching process 40, such as a dry etching back process, and/or a polishing process is carried out to further remove a portion of the CESL 20, the spacers 24 and the hard mask layers 32 until the height of the stack structures 16 within both the transistor region 100 and the non-transistor region 200 is down to a second predetermined height D2. It is obvious that the second predetermined height D2 is lower than the first predetermined height D1 since an upper portion of the hard mask layers 32 is slightly removed during this etching and/or polishing process. Preferably, less than one-half of each hard mask layer 32 is removed during this stage.

Figure 5:
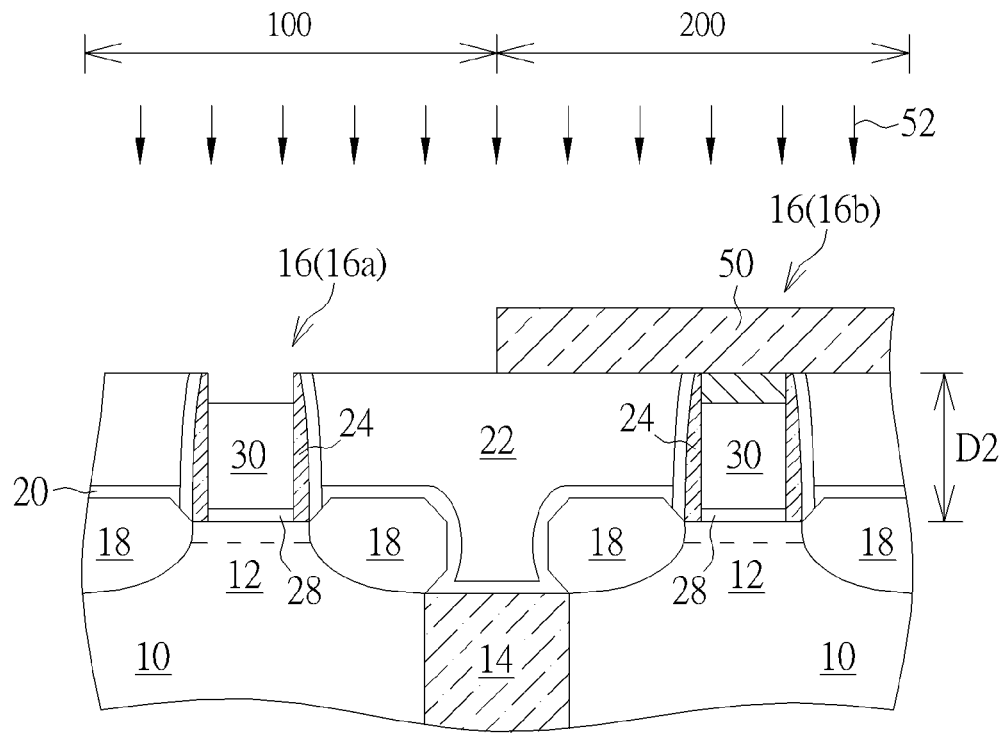
FIG. 5 is a schematic cross-sectional diagram showing a process for etching a hard mask layer in a first stack structure according to one embodiment of the invention.

Please refer to FIG. 5. FIG. 5 is a schematic cross-sectional diagram showing a process for etching a hard mask layer in a first stack structure according to one embodiment of the invention. After the exposure of the hard mask layers 32, a patterned mask layer 50 is formed to cover the hard mask layer 32 within the non-transistor region 200. Preferably, the patterned mask layer 50 is a photoresist layer composed of polymer, but not limited thereto. It may be composed other suitable inorganic materials, such as silicon nitride or SiCN. According to this embodiment, under the coverage of the patterned mask layer 50, an etching process 52, such as a wet etching process, is carried out. Because of the specific etching selectivity between the hard mask layers 32 and the spacers 24, the hard mask layer 32 within the transistor region 100 may be removed completely without reducing or damaging the height of the spacers 24. That is to say, even though the hard mask layer 32 is removed during the etching process, the spacers 24 within the transistor region 100 may remain at the original height, e.g. the second predetermined height D2.

Figure 6:
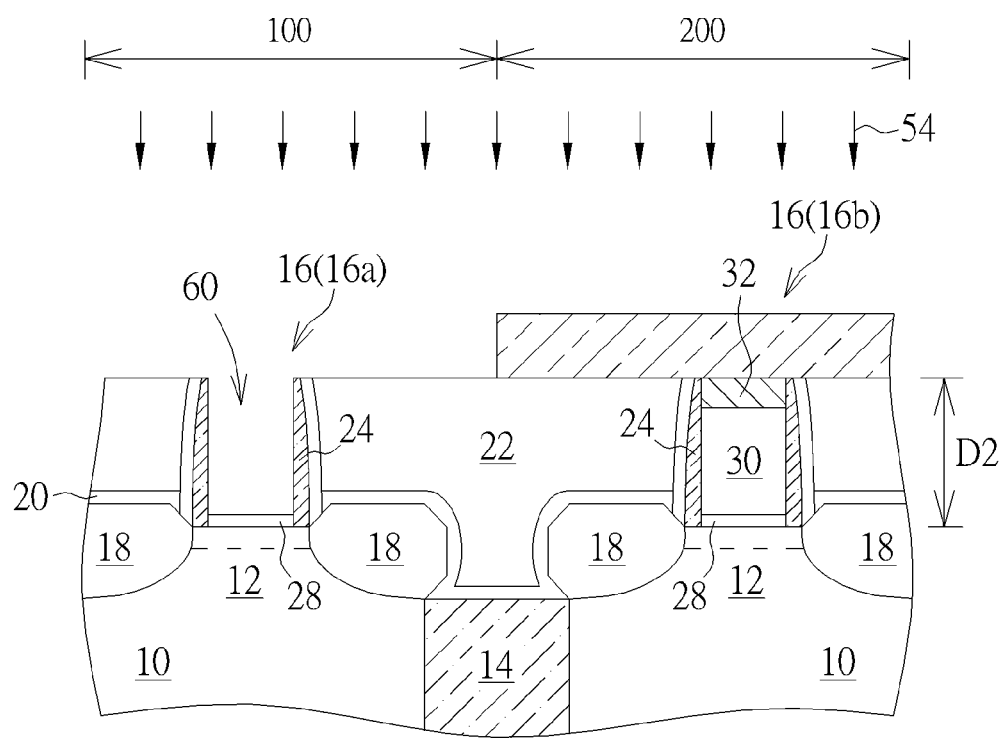
FIG. 6 is a schematic cross-sectional diagram showing a process for etching a semiconductor layer in a first stack structure according to one embodiment of the invention.

Subsequently, please refer to FIG. 6; FIG. 6 is a schematic cross-sectional diagram showing a process for etching a dummy layer in a first stack structure according to one embodiment of the invention. Whether a coverage of the patterned mask layer 50 is present or not, the semiconductor layer 30 within the transistor region 100 may be further removed through suitable etching processes 54. After the removal of the semiconductor layer 30, the interfacial layer 28 within the transistor region 100 may be exposed and a trench 60 is formed.

Figure 7:
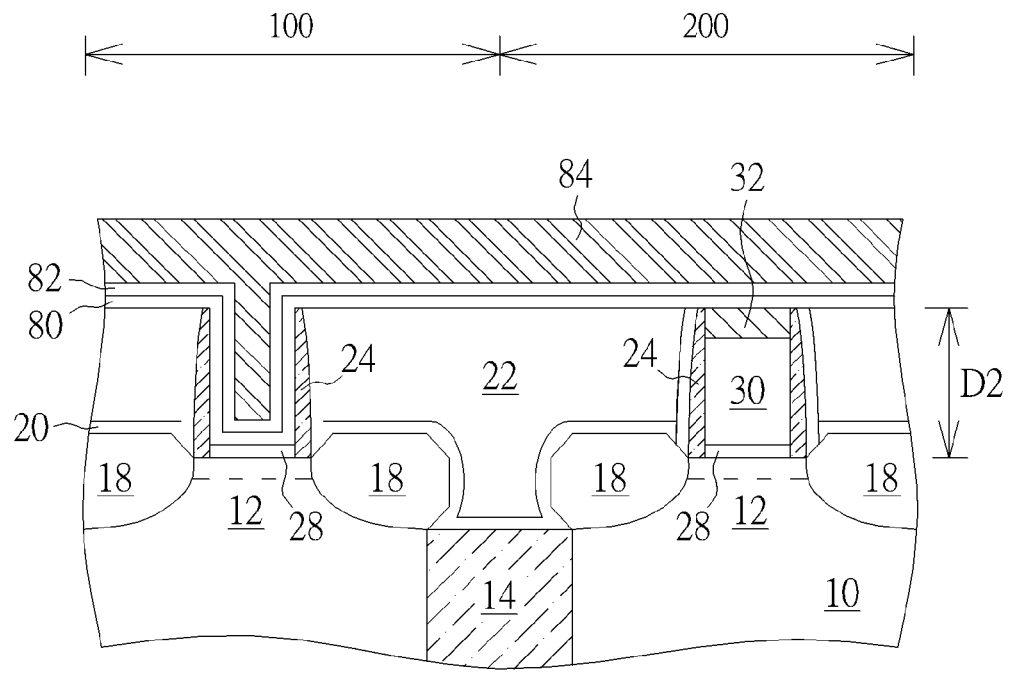
FIG. 7 is a schematic cross-sectional diagram showing a process for sequentially depositing a high-k dielectric layer, a work function metal layer and a conductive layer according to one embodiment of the invention.

FIG. 7 is a schematic cross-sectional diagram showing a process for depositing a high-k dielectric layer, a work function metal layer and a conductive layer according to one embodiment of the invention. A high-k dielectric layer 80, a work function metal layer 82 and a conductive layer 84 are formed sequentially on the sidewalls and bottom of the trench. In this embodiment, the high-k dielectric layer 80 could be a single-layered or a multi-layered structure containing a metal oxide layer such as a rare earth metal oxide, in which the dielectric constant of the gate dielectric layer 106 is substantially greater than 20. As an example, the gate dielectric layer 106 could be selected from the group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide ($Ta_2O_3$), zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Preferably, the work function metal layer 82 is selected from a group consisting of Ti, TiN, Ta, TaN, TiAlN and so forth. The conductive layer 84 is selected from a group consisting of a single metal Al, Ti, Ta, W, Nb, Mo, Cu, TiN, TiC, TaN, Ti/W, and composite metal such as Ti/TiN, but not limited thereto. It should be noted that an adhesive layer (not shown) and/or a barrier layer (not shown) may be optionally disposed between the conductive layer 84 and the work function metal layer 82 if required. The purpose of utilizing the adhesive layer and/or the barrier layer is to improve the adhesivity and the filling ability of the metal layer or to prevent the electro migration or the thermal diffusion of the elements in the conductive layer. For instance, the process may adopt Ti/TiN or Ta/TaN as the adhesive layer when the metal layer includes W; alternatively, the process may adopt Ti/TiN or Ta/TaN as the barrier layer when the metal layer is Al or Cu.

Figure 8:
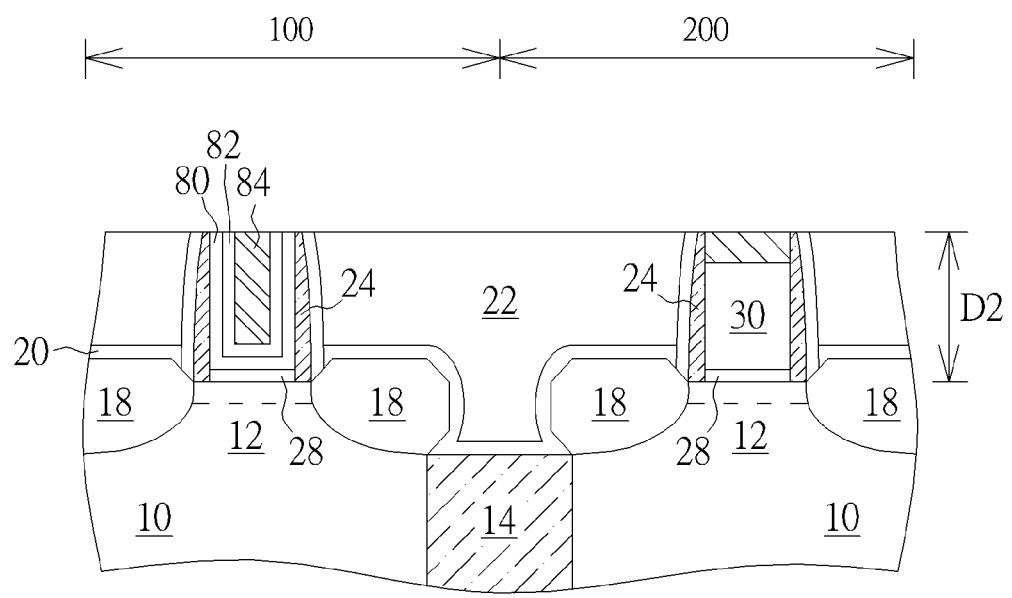
FIG. 8 is a schematic cross-sectional diagram showing a process for removing a conductive layer, a work function metal layer and a high-k dielectric layer outside a trench according to one embodiment of the invention.

FIG. 8 is a schematic cross-sectional diagram showing a process for removing a conductive layer, a work function metal layer and a high-k dielectric layer outside a first trench according to one embodiment of the invention. As shown in FIG. 8, one or multiple planarizing processes, such as CMP processes, are performed to partially remove the conductive layer 84, the work function metal layer 82 and the high-k dielectric layer 80, thereby forming a first metal gate within the transistor region 100. According to this embodiment, since the bottom of the resistor structure 16b is able to surround three faces of a portion of the fin structures, the length of the resistor structure 16b may be increased under the same unit area compared with that of conventional planar resistor structures.

It should be noted that, despite the aforementioned embodiment being applied to a high-k last process, the present invention could also be applied to a high-k first process. Since the high-k first process is well known to those skilled in the art, the detailed description of which is therefore omitted for the sake of clarity.

To summarize, the present invention provides a method of manufacturing a metal gate and a polysilicon resistor. The composition of the spacers provided in the present invention is preferably SiCN, and they are formed through an atomic layer deposition process. Since the difference in etching rates between spacers composed of SiCN and a hard mask layer is high enough, the height of the gate structure may not be reduced seriously when the hard mask layer within a transistor region is removed through a multi-step removing and/or polishing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device, wherein the semiconductor device has a transistor region and a resistor region, the method comprising:

forming a first fin structure and a second fin structure on a substrate, wherein the first fin structure and the second fin structure are in the transistor region and the resistor region respectively;

forming a first stack structure and a second stack structure so as to respectively cover a portion of the first fin structure and of the second fin structure, wherein the first stack structure and the second stack structure respectively include a dummy layer and a hard mask layer from bottom to top;

forming a spacer respectively on sidewalls of the first stack structure and of the second stack structure through an atomic layer deposition process, wherein a composition of the spacers includes silicon carbon nitride;

forming an interlayer dielectric covering the first stack structure, the second stack structure and the spacers;

etching the interlayer dielectric so as to expose each of the hard mask layers;

forming a mask layer to cover the second stack structure and a portion of the dielectric layer;

removing the hard mask layer in the first stack structure under a coverage of the mask layer, wherein after the hard mask layer is removed, the height of the spacer is same as the height of the spacer before the hard mask layer is removed;

removing the dummy layer in the first stack structure to leave a first trench;

forming a high-k dielectric layer above sidewalls and a bottom of the first trench;

forming a work function metal layer on the high-k dielectric layer; and filling up the first trench with a conductive layer after forming the work function metal layer on the high-k dielectric layer.

2. The method according to claim 1, wherein a composition of the hard mask layers includes silicon nitride.

3. The method according to claim 1, wherein each of the spacers is a single-layered spacer or a double-layered spacer.

4. The method according to claim 1, wherein a process for etching the dielectric layer is an etching back process.

5. The method according to claim 4, wherein the etching back process is a dry etching process.

6. The method according to claim 1, wherein a composition of the mask layer is polymer.

7. The method according to claim 1, wherein both the first stack structure and the second stack structure have a first height before etching the interlayer dielectric.

8. The method according to claim 7, wherein the first stack structure and the second stack structure have a second height after etching the interlayer dielectric, wherein the second height is lower than the first height.

9. The method according to claim 8, wherein the second stack structure has the second height after removing the hard mask layer in the first stack structure.

10. The method according to claim 1, wherein a process for removing the hard mask layer in the first stack structure is a selective etching process.

11. The method according to claim 10, wherein the selective etching process is a wet etching process.

12. The method according to claim 1, wherein the dummy layer in the first stack structure is exposed after removing the hard mask layer in the first stack structure.

13. The method according to claim 1, further comprising forming a contact etch stop layer, wherein the contact etch stop layer is disposed between the spacers and the dielectric layer.

14. The method according to claim 13, wherein a composition of the contact etch stop layer includes silicon carbon nitride.

15. The method according to claim 1, further comprising forming an epitaxial layer on the first fin structure and at a side of the first stack structure.

* * * * *